United States Patent
Yamazaki

(10) Patent No.: US 9,398,725 B2
(45) Date of Patent: Jul. 19, 2016

(54) TERMINAL BOX

(71) Applicant: Hosiden Corporation, Yao-shi (JP)

(72) Inventor: Masakazu Yamazaki, Yao (JP)

(73) Assignee: Hosiden Corporation, Osaka (JP)

( * ) Notice: Subject to any disclaimer, the term of this patent is extended or adjusted under 35 U.S.C. 154(b) by 147 days.

(21) Appl. No.: 14/250,823

(22) Filed: Apr. 11, 2014

(65) Prior Publication Data

US 2014/0307408 A1    Oct. 16, 2014

(30) Foreign Application Priority Data

Apr. 12, 2013  (JP) .................................. 2013-083985

(51) Int. Cl.
| H01L 23/473 | (2006.01) |
| --- | --- |
| H05K 7/20 | (2006.01) |
| H02S 40/34 | (2014.01) |

(52) U.S. Cl.
CPC ............ *H05K 7/2039* (2013.01); *H02S 40/345* (2014.12)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723, 756, 741, 686, 687, 725, 787, 361/789, 794, 807–810, 834; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 8,737,042 B2* | 5/2014 | Yoshikawa | H05K 7/20 174/549 |
| --- | --- | --- | --- |
| 2006/0000628 A1* | 1/2006 | Lee | H02G 9/10 174/17 VA |
| 2008/0011348 A1* | 1/2008 | Aoyama | H01R 9/2425 136/244 |
| 2008/0110490 A1* | 5/2008 | Duesterhoeft | H02S 40/345 136/248 |
| 2008/0190477 A1* | 8/2008 | Hattori | H02S 40/345 136/246 |
| 2008/0232040 A1* | 9/2008 | Li | H02G 3/08 361/676 |
| 2008/0253092 A1* | 10/2008 | Duesterhoeft | H01L 31/02008 361/710 |
| 2009/0010002 A1* | 1/2009 | Chen | G06F 1/181 362/282 |

(Continued)

FOREIGN PATENT DOCUMENTS

| DE | 102005022226 A1 | 11/2006 |
| --- | --- | --- |
| DE | 102008022298 B3 | 4/2009 |
| JP | 201171462 A | 4/2011 |

*Primary Examiner* — Anthony Haughton
*Assistant Examiner* — Razmeen Gafur
(74) *Attorney, Agent, or Firm* — The Webb Law Firm

(57) ABSTRACT

A terminal box includes a box body, a plurality of terminal strips connected to a solar cell module; and a diode disposed between the adjacent terminal strips. The box body has a bottom wall coming into contact with a back surface of the solar cell module, and a top wall facing the bottom wall. The terminal strips are disposed in an inner surface of the top wall, and the bottom wall has an opening to expose the terminal strips to the outside as viewed from the bottom. The terminal strips are covered with a molded element from a side of the opening.

8 Claims, 7 Drawing Sheets

(56) References Cited

U.S. PATENT DOCUMENTS

| | | | | |
|---|---|---|---|---|
| 2009/0122492 A1* | 5/2009 | Fischer | H05K 7/20409 | 361/714 |
| 2009/0139763 A1* | 6/2009 | Nagai | H01L 31/02021 | 174/547 |
| 2009/0284930 A1* | 11/2009 | Ice | H05K 7/20418 | 361/715 |
| 2010/0110639 A1* | 5/2010 | Ishida | H02S 40/345 | 361/712 |
| 2010/0151781 A1* | 6/2010 | Slessman | F28F 9/0265 | 454/184 |
| 2010/0163210 A1* | 7/2010 | Kluge | H01L 23/473 | 165/80.3 |
| 2010/0218797 A1* | 9/2010 | Coyle, Jr. | H02S 40/345 | 136/243 |
| 2011/0011641 A1* | 1/2011 | Pfeffer | H05K 7/20409 | 174/547 |
| 2011/0018114 A1* | 1/2011 | Pagaila | H01L 21/561 | 257/686 |
| 2011/0019349 A1* | 1/2011 | Pfeffer | H05K 7/20409 | 361/679.01 |
| 2011/0058337 A1* | 3/2011 | Han | H02S 40/34 | 361/717 |
| 2011/0103020 A1* | 5/2011 | Dangelo | B82Y 10/00 | 361/709 |
| 2012/0028559 A1* | 2/2012 | Kingston | H05K 5/0213 | 454/184 |
| 2012/0048615 A1* | 3/2012 | Masumoto | H02S 40/34 | 174/547 |
| 2012/0125682 A1* | 5/2012 | Lu | H05K 7/20454 | 174/548 |
| 2013/0112377 A1* | 5/2013 | Yang | H05K 7/20263 | 165/120 |
| 2013/0137358 A1* | 5/2013 | Manahan | F24F 13/20 | 454/184 |
| 2013/0141243 A1* | 6/2013 | Watts | H05K 7/20727 | 340/584 |

\* cited by examiner

TERMINAL BOX

CROSS REFERENCE TO RELATED APPLICATIONS

This application is based on and claims priority under 35 U.S.C. Section 119 to Japanese Patent Application No. 2013-083985 filed on Apr. 12, 2013, the entire content of which is incorporated herein by reference.

TECHNICAL FILED

This disclosure relates to a terminal box connected to a solar cell module.

RELATED ART

A plurality of terminal strips are provided within a terminal box connected to a solar cell module, which terminal strips are connected to output tabs from the solar cell module. A bypass diode is disposed between the adjacent terminal strips. The bypass diode functions to apply an electric current by bypassing the solar cell module when the solar cell module is brought to the shade, for example, in which no electric power is generated. As a result, it is prevented that the solar cell module that cannot produce electric power becomes an electric load to lower the efficiency of the power generation of the whole system.

The diode generates heat during use. Such heat may be a cause of malfunction, and thus it is necessary to radiate the heat to the outside. The conventional terminal box is configured to radiate the heat from the diode through metal terminal strips connected to the diode. However, according to the conventional terminal box, the terminal strips are fixed to a bottom surface of the terminal box, that is, to a surface attached to the solar cell module, which causes a problem that a sufficient radiation effect cannot be achieved.

In contrast, according to JP2011-071462A identified below, the diode is disposed in the terminal box so as not to come into contact with a non-photosensitive surface (a back surface) of the solar cell panel. This allows the heat from the diode to be radiated to the outside. In addition, the heat from the solar cell module per se is not easily transmitted to the diode.

SUMMARY

However, in JP2011-071462A, since the interior of the terminal box is charged with a filler after the diode is attached to the terminal box, it is required to wait until the filler is hardened in order to attach the terminal box to the solar cell module. Thus, the working efficiency may be lowered. Moreover, the filler, which is relatively expensive, is charged into the entire interior of the terminal box, which may increase the cost. While JP2011-071462A discloses an embodiment in which no filler is charged into the interior of the terminal box, such an arrangement may not be able to protect connecting portions of the terminal strips, as a result of which the reliability may be lowered.

Embodiments of the present invention provide a terminal box that achieves good working efficiency and good heat radiation performance.

According to one preferable embodiment the present invention, the terminal box includes a box body attached to a back surface of a solar cell module and including a bottom wall coming into contact with the back surface of the solar cell module and a top wall facing the bottom wall, a plurality of terminal strips connected to output tabs of the solar cell module, and a diode disposed between the adjacent terminal strips. The terminal strips are disposed in an inner surface of the top wall, the bottom wall has an opening to expose the terminal strips to the outside as viewed from the bottom, and a molded element is provided to cover the terminal strips from a side of the opening.

With the above-described arrangement, the terminal strips are disposed in the inner surface of the top wall of the box body. The top wall faces the bottom wall attached to the solar cell module, and thus is in contact with the outside air. Therefore, heat transmitted from the diode to the terminal strips can be radiated to the outside air through the top wall. The heat from the diode is also transmitted from the terminal strips to the molded element, and thus can be radiated through the molded element as well.

Further, with the above arrangement, it is possible to protect the terminal strips attached to the box body only by attaching the molded element to the bottom opening of the terminal box. Therefore, there is no need to wait until the filler is hardened as in the conventional terminal box. This can ensure that the terminal strips can be reliably protected with high working efficiency.

It is preferable that the molded element is made of resin to come into tight contact with the terminal strips. This allows the heat from the diode to be radiated through the terminal strips and the molded element.

It is also preferable that radiation grooves are formed in a bottom surface of the molded element. This facilitates the heat radiation through the molded element. Further, those grooves formed in the molded element can prevent sink marks when the molded element is injection molded.

According to another preferable embodiment of the present invention, the molded element has a recess for receiving the diode, a gap is formed between an inner peripheral surface of the recess and an outer peripheral surface of the diode, and the inner peripheral surface of the recess and the outer peripheral surface of the diode are fixed to each other via an adhesive.

With the above-described arrangement, since the inner peripheral surface of the recess and the outer peripheral surface of the diode are fixed to each other via the adhesive, the heat from the diode can be transmitted directly to the molded element. The adhesive preferably has high thermal conductivity.

According to a further preferable embodiment of the present invention, a radiator plate made of metal is disposed in an outer surface of the top wall. With such an arrangement, the heat transmitted from the terminal strips is transmitted to the top wall, and then radiated to the outside air through the radiator plate, which can enhance the heat radiation performance. The radiator plate is preferably disposed on a top surface of the top wall, which corresponds to the inner surface to which the terminal strips are fixed.

DESCRIPTION OF EMBODIMENTS

Figure 1:
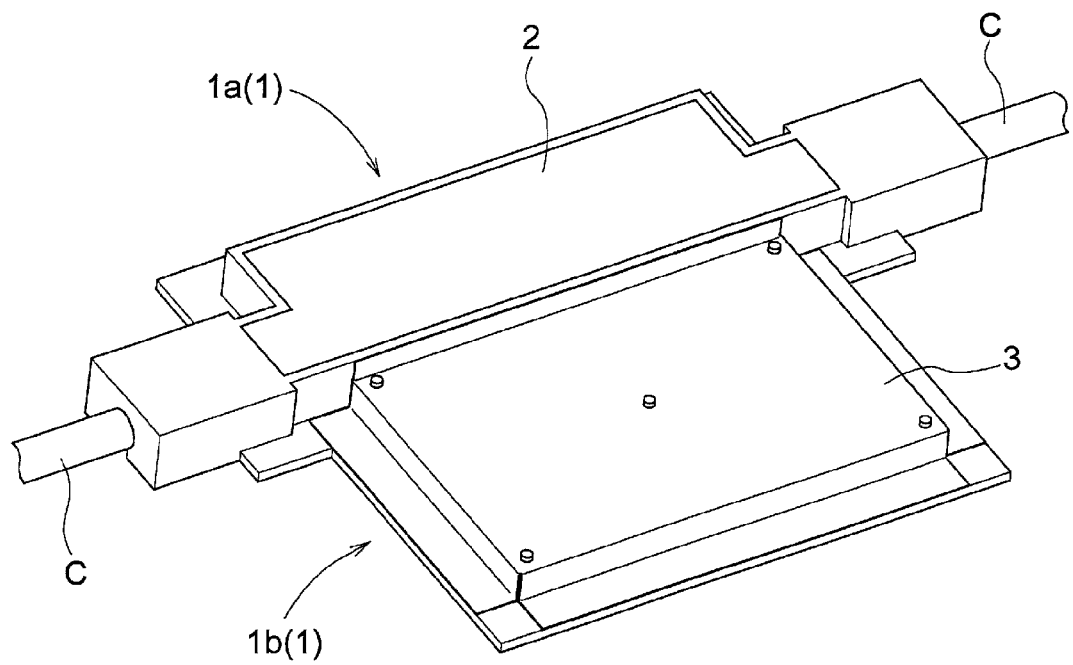
FIG. 1 is a perspective view of a terminal box from above.
Figure 2:
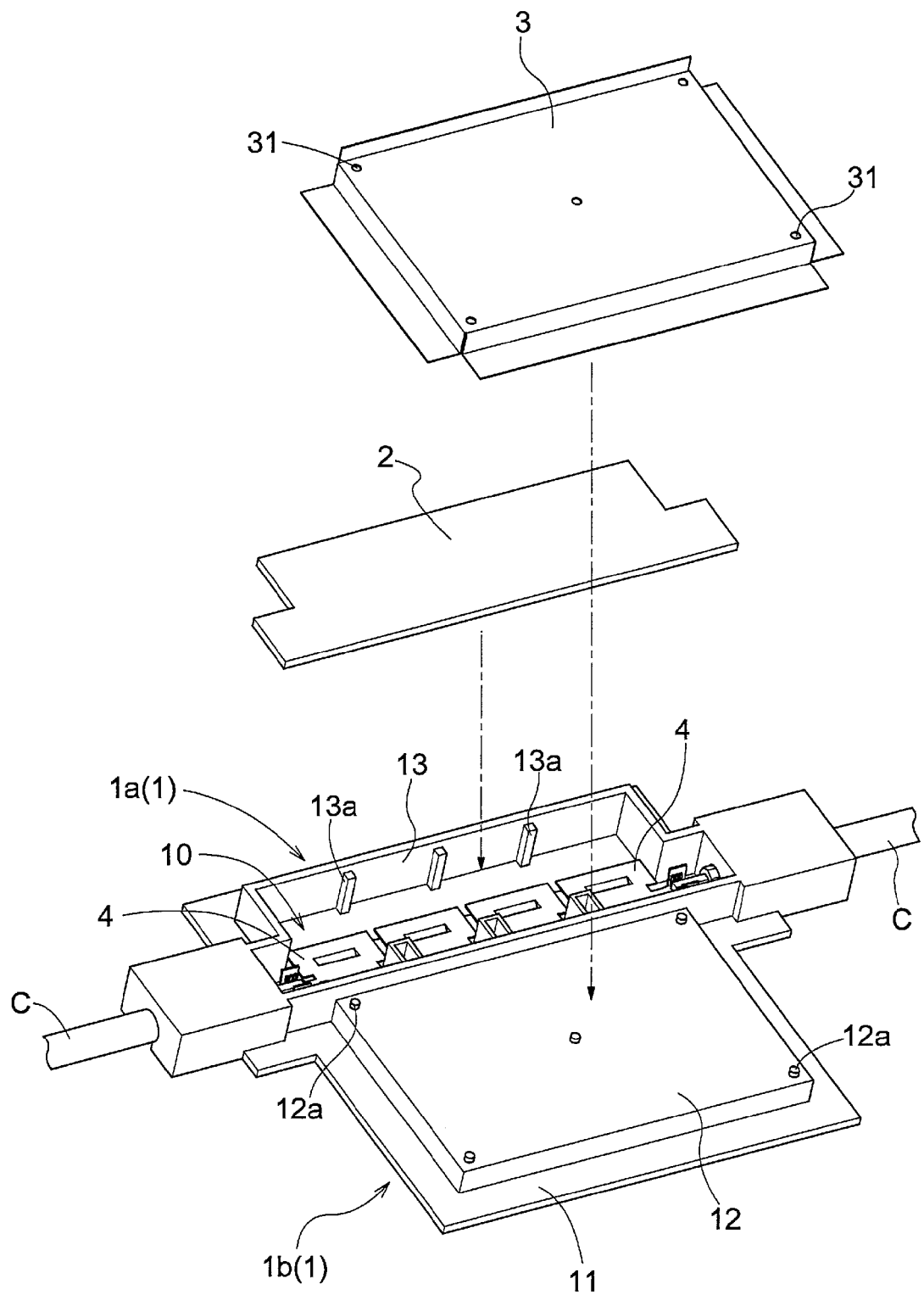
FIG. 2 is a partially exploded prospective view of the terminal box from above.

A terminal box according to one embodiment of the present invention will be described hereinafter in reference to the accompanying drawings. FIG. 1 is a perspective view of the terminal box from above, and FIG. 2 is a partially exploded prospective view of the terminal box from above. The terminal box is attached to a back surface of a solar cell module (not shown) with a posture shown in FIG. 1. Thus, the posture of the terminal box in FIG. 1 is shown upside down in view of a use condition. In the description hereinafter, three-dimensional directions are defined as follows. A direction along an extending direction of output cables C is defined as a "transverse direction," and a direction normal to the output cables C and parallel to a largest plane of a lid 2 described later is defined as a "fore-and-aft direction" (a side adjacent to a first main body 1a described later is defined as the "front," and a side adjacent to a second main body 1b described later is defined as the "rear"). A direction vertical to the transverse direction and the fore-and-aft direction is defined as a "vertical direction." In FIG. 1, a side from which a radiator plate 3 described later can be visually confirmed is an upper side.

The terminal box includes a box body 1 made of resin, a lid 2, and a plurality of (four in the current embodiment) terminal strips 4. The terminal strips 4 are accommodated within the box body 1 and connected to corresponding output tabs of the solar cell module.

The box body 1 consists of the first main body 1a and the second main body 1b. The second main body 1b is adjacent to and arranged behind the first main body 1a to be a little thinner than the first main body 1a. The output cables C are connected to lateral opposite ends of the first main body 1a for supplying electric power from the solar cell module to the outside.

The box body 1 further includes a bottom wall 11, a top wall 12 and a side wall 13 extending over the first main body 1a and the second main body 1b. An upper opening 10 is formed in the bottom wall 11 of the first main body 1a. The lid 2 covers the upper opening 10 from above.

A plurality of ribs 13a are formed in an inner surface of the side wall 13 for fixedly supporting the lid 2. The bottom wall 11 projects outward from the side wall 13 to form a flange and has a bottom surface to be attached to the back surface of the solar cell module.

The radiator plate 3 made of metal is attached to a top surface of the second main body 1b. While the top wall 12 has a plurality of engagement projections 12a formed in a top surface thereof, the radiator plate 3 has engagement holes 31 formed in positions corresponding to the engagement projections 12a. The engagement projections 12a are fitted into the engagement holes 31 in attaching the radiator plate 3 to the top wall 12.

Figure 3:
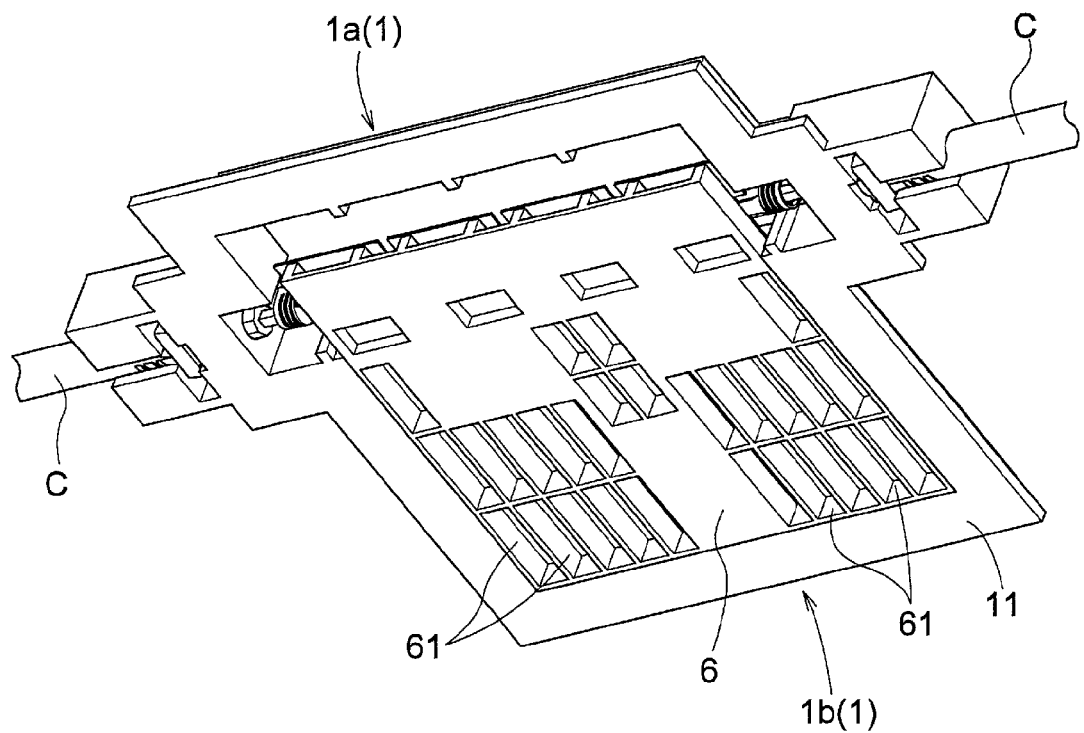
FIG. 3 is a perspective view of the terminal box from below.
Figure 4:
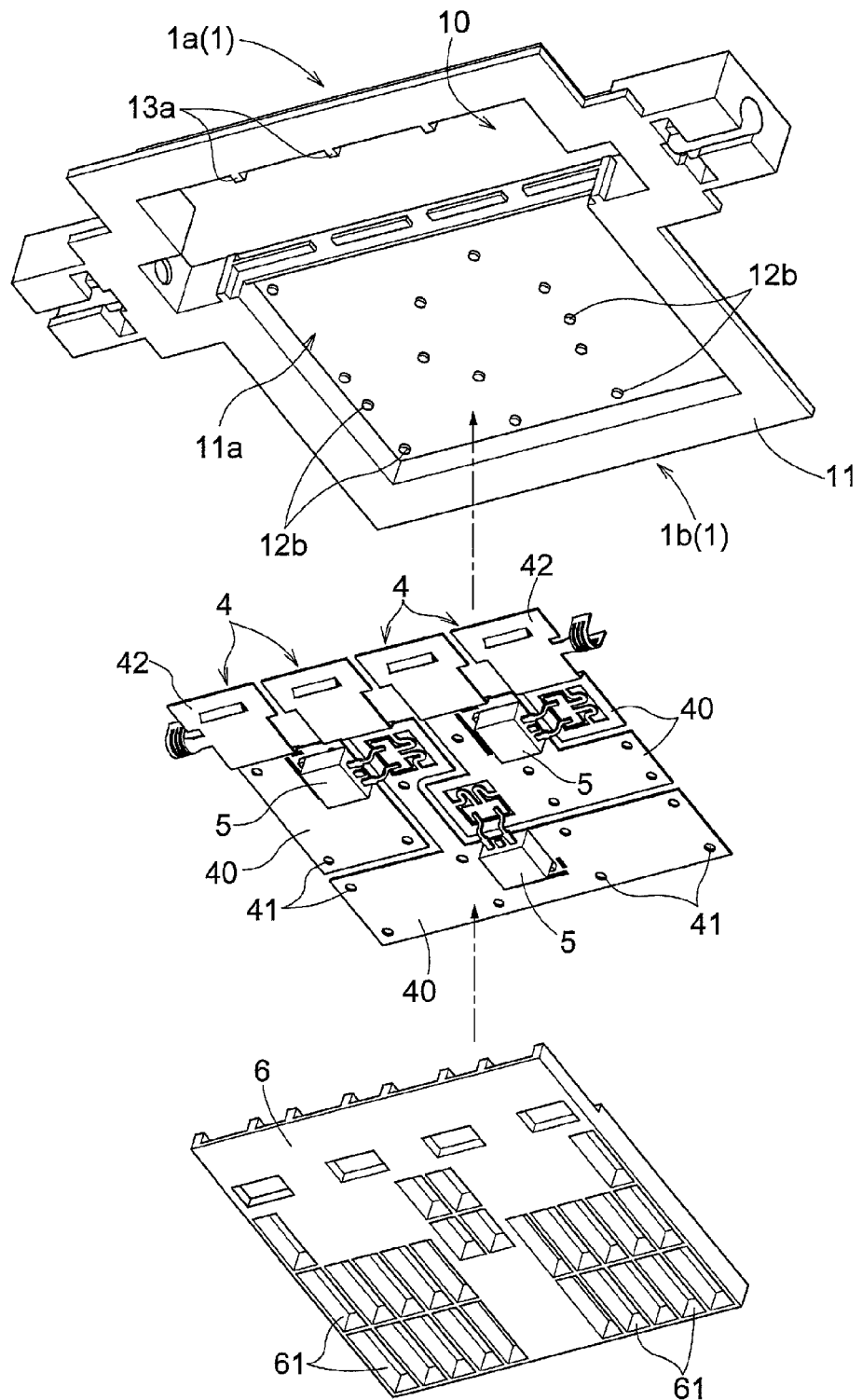
FIG. 4 is a partially exploded prospective view of the terminal box from below.
Figure 5:
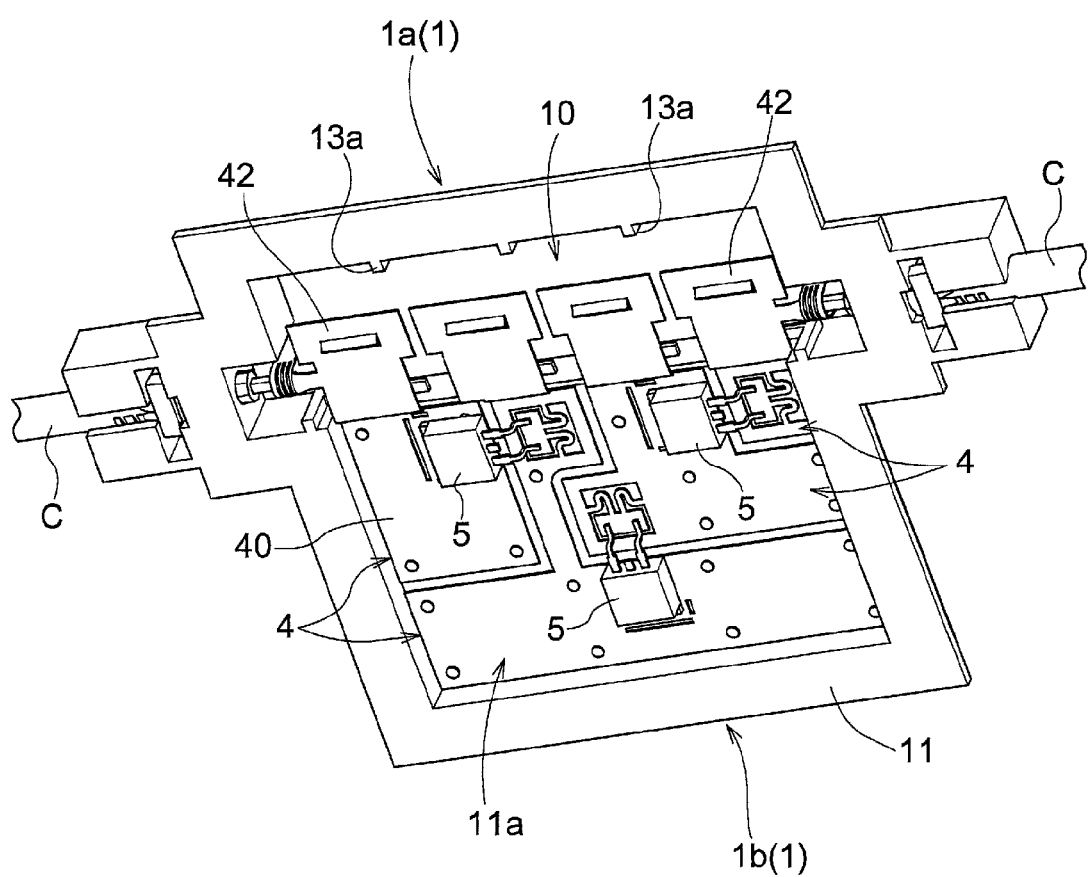
FIG. 5 is a perspective view of the terminal box from below with a lid and a spacer being removed.

FIG. 3 is a perspective view of the terminal box from below, and FIG. 4 is a partially exploded prospective view of the terminal box from below. FIG. 5 illustrates a state in which the terminal strips 4 are attached. As seen from FIG. 4, a lower opening 11a is formed in the bottom wall 11 of the box body 1 over an entire area defined inward of the side wall 13.

Each of the terminal strips 4 consists of a main element 40 and a connection part 42 provided forward of the main element 40. The output tab (not shown) of the solar cell module is connected to the connection part 42. Referring to FIGS. 2 and 5, the plurality of terminal strips 4 are arranged in parallel with the connection parts 42 being exposed through the upper opening 10, which can connect the output tabs of the solar cell module to the connection parts 42 of the terminal strips 4 through the upper opening 10.

A plurality of engagement projections 12b are formed in a bottom surface, that is, an inner surface of the upper wall 12 of the second main body 1b. The engagement projections 12b of the box body 1 are fitted into engagement holes 41 of the terminal strips 4, thereby to attach the terminal strips 4 to the inner surface of the upper wall 12 of the box body 1 as shown in FIG. 5.

A diode 5 acting as a bypass diode is provided between the adjacent terminal strips 4. The diode 5 functions to apply an electric current by bypassing the solar cell module when the solar cell module is brought to the shade, for example, in which no electric power is generated. As a result, it is prevented that the solar cell module that cannot produce electric power becomes an electric load to lower the efficiency of the power generation of the whole system.

Referring to FIG. 3, a spacer 6 (one example of a molded element in the present invention) made of resin is provided under the box body 1 to cover the terminal strips 4. More particularly, the spacer 6 is configured to cover a portion of a lower opening 11a other than a front end part from below. Thus, the lower opening 11a is still available at the front end thereof even if the spacer 6 is attached to the box body 1. The output tabs of the solar cell module can be drawn into the interior of the terminal box through the portion of the lower opening 11a that is not closed by the spacer 6. Further, by covering under the terminal strips 4 with the spacer 6, it is not required to wait until a filler charged in fixed portions of the terminal strips 4 is hardened, which enhances the working efficiency.

A plurality of grooves 61 (one example of radiation grooves in the present invention) are formed in a bottom surface of the spacer 6. Those grooves 61 can prevent sink marks when the spacer 6 is injection molded, and also can increase a surface area of the spacer 6.

Figure 6:
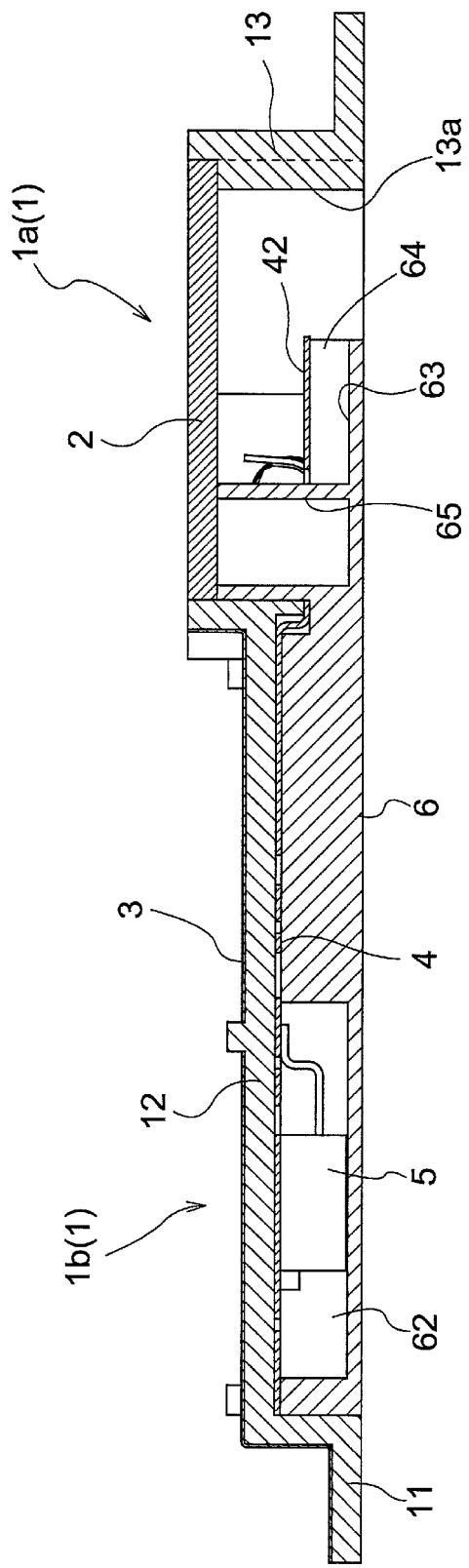
FIG. 6 is a side vertical sectional view of the terminal box.
Figure 7:
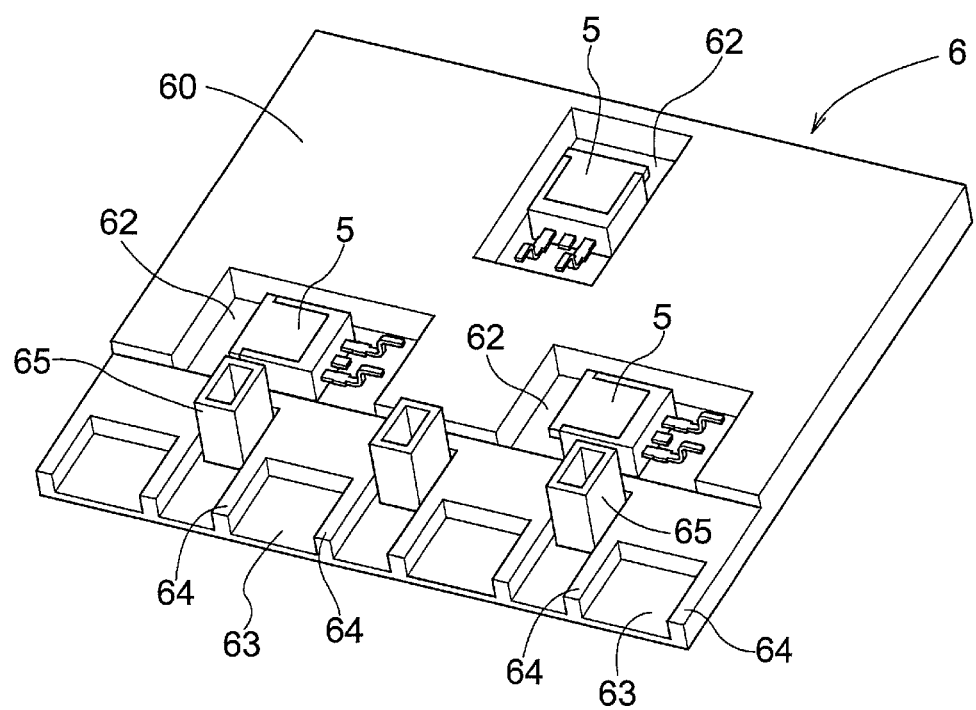
FIG. 7 is a perspective view of the spacer.

On the other hand, a diode receiving recess 62 is formed in a top surface of the spacer 6 as seen from FIGS. 6 and 7. Referring to FIG. 6, when the space 6 is attached to the box body 1, the main element 40 of the terminal strip 4 comes into surface contact with a top surface 60 of the spacer 6, and the diode 5 is housed in the diode receiving recess 62. The diode receiving recess 62 has a size greater than a size of a generally used diode so as to adapt to diodes of various dimensions. To this end, a gap is formed between a periphery of the diode 5 and an inner surface of the diode receiving recess 62. The periphery of the diode 5 is secured to the inner surface of the diode receiving recess 62 with an adhesive. In the current embodiment, a bottom surface of the diode 5 comes into contact with a bottom surface of the diode receiving recess 62. If the bottom surface of the diode 5 is not in contact with the bottom surface of the diode receiving recess 62, those surfaces may be secured with each other with the adhesive as well. The adhesive preferably has high thermal conductivity.

An output tab insertion recess 63 is formed in the front end part of the top surface of the spacer 6. When the spacer 6 is attached to the box body 1, the connection part 42 of the terminal strips 4 comes into contact with top surfaces of right and left ribs 64 forming the output tab insertion recess 63. The output tab drawn into the interior of the terminal box through the lower opening 11a is guided toward the terminal strip 4 through the output tab insertion recess 63 and connected to the connection part 42 of the terminal strip 4.

Hollow struts 65 each having a generally quadrangular prism is formed at the front end of the top surface of the spacer 6. More particularly, each strut 65 is disposed a little behind and between the adjacent output tab insertion recesses 63. The struts 65 have top surfaces cooperating with the ribs 13a of the side wall 13 to support and fix the lid 2 from below.

The terminal box is assembled as follows. First, the plurality of terminal strips 4 are arranged to be fixed to the box body 1, and the diodes 5 are secured between the adjacent terminal strips 4. In this state, the engagement holes 41 of the terminal strips 4 are fitted on the engagement projections 12b of the box body 1, thereby to secure the terminal strips 4 by heat-fusion, for example. Then, the spacer 6 is attached to the box body 1 from below. On the other hand, the engagement projections 12a formed on the top surface of the second main body 1b are fitted into the engagement holes 31 of the radiator plate 3, thereby to fix the radiator plate 3 to the box body 1.

With the terminal box having assembled in this manner, the output tabs from the solar cell panel are drawn into the interior of the terminal box through the lower opening 11a, thereby to fix the terminal box to the back surface of the solar cell module by the adhesive or the like. The output tabs drawn into the interior of the terminal box are guided toward the connection parts 42 of the terminal strips 4 through the output tab insertion recesses 63 and connected to the connection parts 42 by soldering. The filler is charged through the upper opening 10 in this state to protect the connecting portions between the output tabs and the connection parts 42. Then, the upper opening 10 is closed with the lid 2.

When the terminal box is attached to the solar cell module to operate the system, the diodes 5 generate heat. The heat is transmitted to the terminal strips 4 from the diodes 5. The terminal strips 4 are attached to the inner surface of the top wall 12 of the box body of the terminal box according to the current embodiment. The top wall 12 faces the bottom wall 11 to be attached to the solar cell module and is capable of coming into contact with the outside air. Thus, the heat transmitted to the terminal strips 4 is easily radiated to the outside air through the top wall 12. In addition, the radiator plate 3 made of metal is attached to the top wall 12, which facilitates the heat radiation.

Further, since the terminal strips 4 are in contact with the spacer 6 as well, the heat transmitted to the terminal strips 4 can be released to the spacer 6. Moreover, since the diodes 5 are fixed to the spacer 6 via the adhesive, the heat also can be transmitted from the diodes 5 directly to the spacer 6. On the other hand, the spacer 6 has a large surface area due to the provision of the grooves 61, which can easily radiate the heat transmitted thereto.

INDUSTRIAL APPLICABILITY

Embodiments of the present invention can be used in a terminal box connected to a solar cell module.

What is claimed is:

1. A terminal box comprising:
a box body attached to a back surface of a solar cell module and including a bottom wall coming into contact with the back surface of the solar cell module, and a top wall facing the bottom wall;
a plurality of terminal strips connected to output tabs of the solar cell module; and
a diode disposed between the adjacent terminal strips,
wherein the terminal strips have one surface coming into tight contact with an inner surface of the top wall,
the bottom wall has an opening to expose the terminal strips to the outside as viewed from the bottom, and
a molded element made of resin is attached to the box body from a side of the opening after the resin is hardened to cover and come into tight contact with the other surface of the terminal strips.

2. The terminal box according to claim 1, wherein radiation grooves are formed in a bottom surface of the molded element.

3. The terminal box according to claim 1, wherein the molded element has a recess for receiving the diode,
a gap is formed between an inner peripheral surface of the recess and an outer peripheral surface of the diode, and
the inner peripheral surface of the recess and the outer peripheral surface of the diode are fixed to each other via an adhesive.

4. The terminal box according to claim 1, wherein a radiator plate made of metal is disposed in an outer surface of the top wall.

5. The terminal box according to claim 2, wherein the molded element has a recess for receiving the diode,
a gap is formed between an inner peripheral surface of the recess and an outer peripheral surface of the diode, and
the inner peripheral surface of the recess and the outer peripheral surface of the diode are fixed to each other via an adhesive.

6. The terminal box according to claim 2, wherein a radiator plate made of metal is disposed in an outer surface of the top wall.

7. The terminal box according to claim 3, wherein a radiator plate made of metal is disposed in an outer surface of the top wall.

8. The terminal box according to claim 5, wherein a radiator plate made of metal is disposed in an outer surface of the top wall.

* * * * *